United States Patent
Tsai et al.

(10) Patent No.: US 6,245,639 B1
(45) Date of Patent: *Jun. 12, 2001

(54) METHOD TO REDUCE A REVERSE NARROW CHANNEL EFFECT FOR MOSFET DEVICES

(75) Inventors: ChaoChieh Tsai, Taichung; Yuan-Chen Sun, Hsin-Chu, both of (TW)

(73) Assignee: Taiwan Semiconductor Manufacturing Company, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,291

(22) Filed: Feb. 8, 1999

(51) Int. Cl.[7] ................. H01L 21/8238; H01L 21/76; H01L 21/425
(52) U.S. Cl. ............... 438/424; 438/221; 438/433; 438/524
(58) Field of Search .................... 438/224, 221, 438/305, 433, 524, 231, 424

(56) References Cited

U.S. PATENT DOCUMENTS

| 4,578,128 | * | 3/1986 | Mundt et al. . | |
| 4,599,789 | * | 7/1986 | Gasner . | |
| 4,653,177 | * | 3/1987 | Lebowitz et al. . | |
| 5,372,950 | | 12/1994 | Kim et al. | 437/24 |
| 5,683,932 | * | 11/1997 | Bashir et al. . | |
| 5,691,215 | * | 11/1997 | Dai et al. . | |
| 5,733,813 | | 3/1998 | Chen et al. | 438/440 |
| 5,770,504 | * | 6/1998 | Brown et al. . | |
| 5,801,083 | * | 9/1998 | Yu et al. . | |
| 5,811,347 | | 9/1998 | Gardner et al. | 438/435 |
| 5,874,346 | * | 2/1999 | Fulford, Jr. et al. . | |
| 5,880,008 | * | 3/1999 | Akiyama et al. . | |
| 5,960,276 | * | 9/1999 | Liaw et al. . | |

OTHER PUBLICATIONS

Ono et al., "TED Control Technology for Suppression of Reverse Narrow Channel Effect in 0.1 $\mu$m MOS Devices", IEDM 97, pp. 227–230.

\* cited by examiner

Primary Examiner—John F. Niebling
Assistant Examiner—Ron Pompey
(74) Attorney, Agent, or Firm—George O. Saile; Stephen B. Ackerman

(57) ABSTRACT

A process for fabricating a narrow channel width, MOSFET device, with a reduced reverse narrow channel effect, (RNCE), has been developed. The reduction of the level of dopant depletion, from the channel region, to the interface of a shallow trench —channel region, has been achieved via use of a large angle, nitrogen ion implantation procedure, performed to exposed surfaces of a shallow trench shape, prior to insulator fill. A nitrogen rich, silicon layer, at the shallow trench —channel interface, reduces the level of boron depletion, from the channel region, to the RIE damaged region, near the shallow trench shape.

14 Claims, 4 Drawing Sheets

METHOD TO REDUCE A REVERSE NARROW CHANNEL EFFECT FOR MOSFET DEVICES

BACKGROUND OF THE INVENTION

(1) Field of the Invention

The present invention relates to methods used to fabricate semiconductor devices, and more specifically a method used to reduce a reverse narrow channel effect, (RNCE), encountered in narrow channel width, metal oxide semiconductor field effect transistors, (MOSFET).

(2) Description of the Prior Art

Micro-miniaturization, or the ability to create semiconductor devices, using sub-micron features, have allowed the semiconductor industry to improve the performance of MOSFET devices. The reduction in feature dimensions, result in a significant decrease in performance degrading capacitance and resistance values, allowing the higher performing MOSFET devices to be realized. However as the channel length, and channel width, of MOSFET devices are decreased, unwanted phenomena, such as a reverse narrow channel effect, (RCNE), have to be addressed. The RCNE phenomena entails a depletion of dopant, such as boron for an N channel, MOSFET device, in the channel region, resulting in unwanted, lower than designed, threshold voltages. The depletion of boron in the channel region, results from boron moving away from the channel region, piling up at the lightly doped source/drain, (LDD), —channel interface, or piling up at the isolation —channel interface. It is believed that the defects generated at these interfaces, creating a region of interstitial silicon, as a result of implantation damage at the LDD interface, or as a result of reactive ion etching, (RIE), used to create a shallow trench isolation shape, enhance the movement of boron, from the channel region, to these interfaces. In addition, as the width of the channel region decreases, the effect of boron depletion becomes more pronounced, and thus the RCNE phenomena becomes a critical deterrent to yield and performance for MOSFET devices, designed with narrow channel widths.

This invention will describe a method in which the RCNE phenomena is reduced by restricting the pile up of boron, at the shallow trench isolation region —channel interface. This is accomplished via use of a large angle, nitrogen ion implantation procedure, applied to a shallow trench shape, prior to filling with insulator. The implanted nitrogen region, at the sides of the shallow trench shape, reduce the movement of boron to the defective sides of the shallow trench shape, resulting in an increased level of boron, in the channel region, compared to counterparts fabricating without the use of the nitrogen ion implantation procedure, thus resulting in a reduction of the RCNE phenomena. Prior art, such as Ono et al, in the article, "TED Control Technology for Suppression of Reverse Narrow Channel Effect in 0.1 um MOS Devices", appearing in *IEDM* 97, pages 227–230, describe a blanket nitrogen, ion implantation procedure, performed after a shallow trench has been filled. However that prior art would not place the desired nitrogen ion implanted region, at the sides of the shallow trench, or at the shallow trench —channel region interface. This invention, using a novel, large angle, nitrogen ion implantation procedure, prior to filling of the shallow trench, creates the blocking nitrogen rich, silicon layer, at the preferred location, the sides of the shallow trench.

SUMMARY OF THE INVENTION

It is an object of this invention to fabricate a narrow channel width, MOSFET device.

It is another object of this invention to use insulator filled, shallow trench regions, for isolation purposes.

It is still another object of this invention to perform a large angle, nitrogen ion implantation procedure, to a shallow trench shape, prior the insulator filling of the shallow trench.

In accordance with the present invention a process for reducing the RNCE phenomena, for narrow width channel MOSFET devices, via a large angle, nitrogen ion implantation procedure, performed to a shallow trench shape, prior to insulator fill of the shallow trench, is described. After forming a shallow trench, in a masking insulator layer, and in the semiconductor substrate, a thin silicon oxide layer is thermally grown on the exposed surfaces of the shallow trench. A large angle, nitrogen ion implantation procedure is next performed, placing nitrogen ions, in the semiconductor substrate, near the sides of the shallow trench. Filling of the shallow trench is accomplished via chemical vapor deposition of an insulator layer, followed by the removal of regions of the trench filling, insulator layer, as well as removal of the masking insulator layer, from the top surface of the semiconductor substrate. A narrow channel width, MOSFET device is then formed in an active region of the semiconductor substrate, featuring the reduction of channel dopant depletion, that can occur as a result of diffusion of channel dopant to isolation regions, during subsequent thermal cycles. The reduction in channel dopant depletion is realized as a result of a nitrogen rich, silicon layer, formed via the large angle, ion implantation procedure, located near the sides of the shallow trench.

BRIEF DESCRIPTION OF THE DRAWINGS

The object and other advantages of this invention are described in the preferred embodiment with reference to the attached drawings that include.

DESCRIPTION OF THE PREFERRED EMBODIMENT

The method of creating a narrow channel width MOSFET device, using a large angle, nitrogen ion implanted implantation procedure, creating a nitrogen rich, silicon layer, at the sides of a shallow trench shape, and used to reduce channel dopant depletion, or to reduce a reverse narrow channel effect, will now be described in detail. Although this invention is applied to MOSFET devices with narrow channel widths, the creation of the nitrogen rich, silicon layer, at the sides of the shallow trench shape, can be applied to MOSFET devices of any channel width. In addition this invention can be applied to MOSFET devices using LOCOS, (localized oxidation of silicon).

Figure 1A:
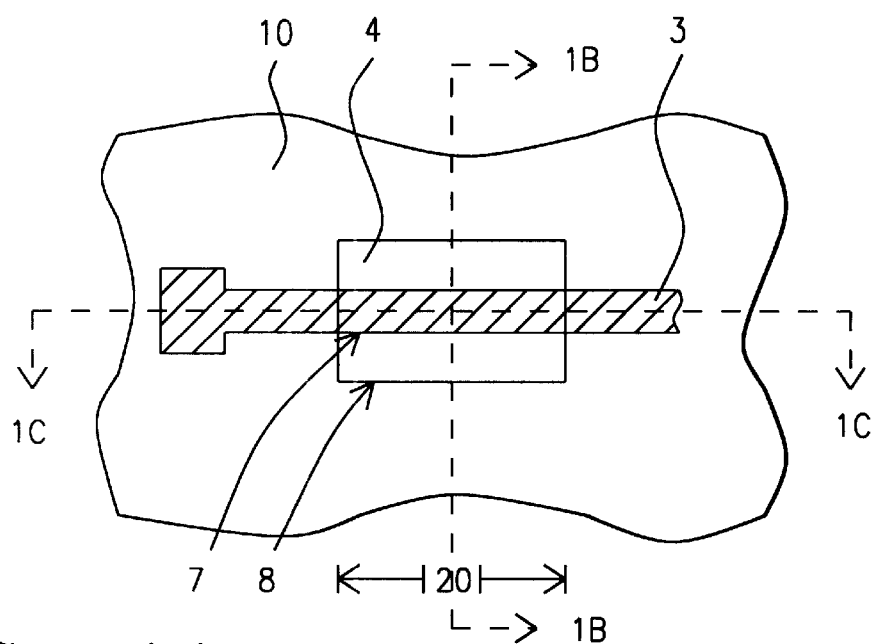
FIGS. 1A, 1B, and 1C, which schematically show a narrow channel width, MOSFET device, fabricated without the use of a large angle, nitrogen ion implantation procedure, applied to a shallow trench shape.

FIG. 1A, schematically shows a top view of a narrow channel width, MOSFET device. Channel width 20, is determined by the width of the active device region, shown in FIG. 1A, with the active device region filled by lightly doped source/drain, (LDD), region 4, and with the active device region also comprised of a channel region, the region directly underlying gate structure 3. The threshold voltage of this NFET device is a function of the boron dopant in the channel region, however the level of boron remaining in the channel region, at the completion of the MOSFET fabrication procedure, can depend on thermal procedures, as well as the width of channel region 20. For example edge 7, of the ion implanted LDD region 4, as well as STI, shallow trench isolation), edges 8, formed from insulator filled shallow trench region 10, can result in the formation interstitial silicon, generated during the ion implantation, or shallow trench reactive ion etching procedures. Subsequent thermal cycles result in boron movement, to these edges, or to these damaged regions, thus reducing the desired level of boron in the channel region, thus not allowing the desired, or designed, threshold voltage to be realized. In addition the smaller width of the active device region, or the narrower the space between the shallow trench isolation regions, the more pronounced the boron depletion, or the reverse narrow channel effect, (RNCE).

Figure 1B:
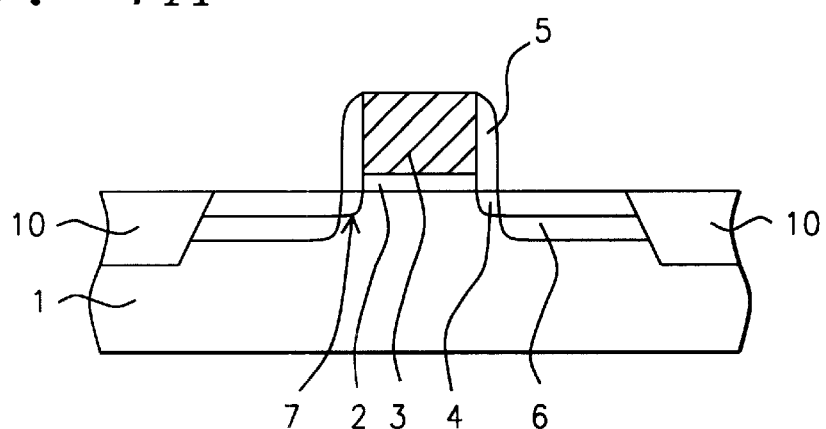
Figure 1C:
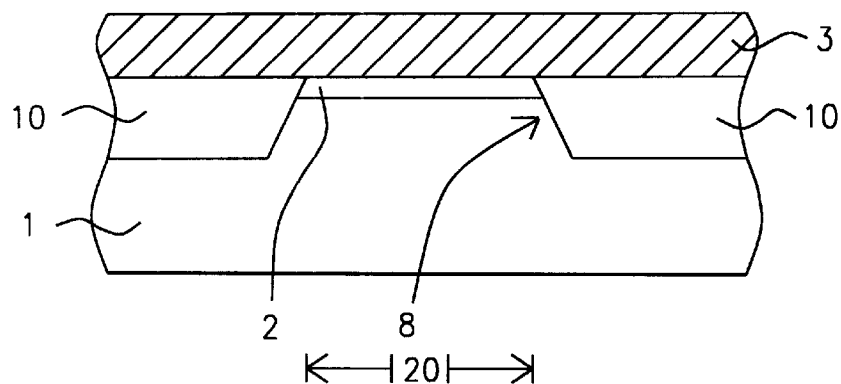

FIG. 1B, schematically shows the MOSFET device, of FIG. 1A, in cross-sectional style. LDD region 4, created via an ion implantation procedure, results in the formation of edge 7, at the LDD —channel interface, with the presence of interstitial silicon, located at edge 7. The interstitial silicon will allow movement of boron to occur from the channel region, underlying gate insulator 2, and gate structure 3, to edge 7, during the subsequent thermal cycles. Subsequent thermal cycles can include the formation of the gate insulator layer, the deposition of the layer used for insulator spacers 5, and the anneal cycle used to activate the ion implanted species of LDD region 4, and of heavily doped source/drain region 6. FIG. 1C, schematically shows another cross-sectional view, showing channel width 20, located between STI regions 10, and showing the shallow trench edge 8, comprised again of interstitial silicon, created as a result of damage introduced during the reactive ion etching procedure, used to define the shallow trench shape. Again, as was the case with edge 7, the interstitial silicon, at edge 8, will enhance the movement of, or allow boron to be depleted from the channel region, to edge 8, resulting in undesired RCNE phenomena.

Figure 2:
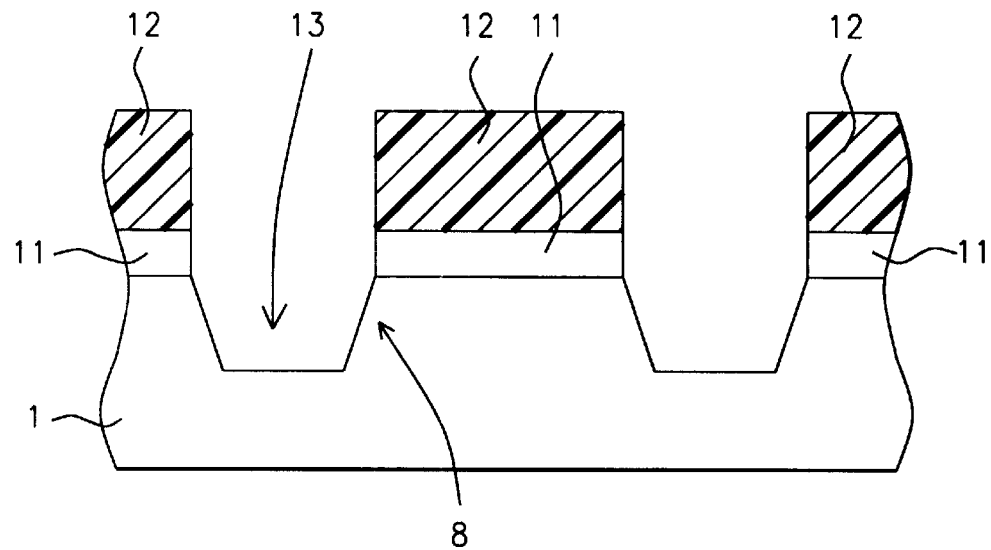
FIGS. 2–4, 5B–5C, which schematically in cross-sectional style, and FIG. 5A, using a top view schematic, show the key stages of fabrication, used to form a narrow channel width, MOSFET device, featuring a large angle, nitrogen ion implantation procedure, creating a nitrogen rich, silicon layer, located near the sides of isolation regions, used to reduce channel dopant depletion, during thermal cycles.

The process used to reduce the RNCE phenomena will now be described, with the key stages of fabrication shown schematically in FIGS. 2–4, 5A, 5B, and 5C. A P type, semiconductor substrate 1, comprised of single crystalline silicon, with a <100> crystallographic orientation, is used and schematically shown in FIG. 1. A thick silicon nitride layer 11, to be used to restrict a subsequent nitrogen ion implantation procedure, to only a shallow trench shape, is obtained using either low pressure chemical vapor deposition, (LPCVD), or plasma enhanced chemical vapor deposition, (PECVD), procedures, at a thickness between about 1000 to 3000 Angstroms. Photoresist shape 12, is then used as a mask to allow a reactive ion etching, (RIE), procedure, using $CHF_3$ as an etchant for thick silicon nitride layer 11, and using $Cl_2$ as an etchant for semiconductor substrate 1, to create shallow trench shape 13, at a depth between about 3000 to 4000 Angstroms in semiconductor substrate 1. This is schematically shown in FIG. 2. Edge 8, or the interface between shallow trench shape 13, and semiconductor substrate 1, is comprised of interstitial silicon, resulting from damage created during the shallow trench shape RIE procedure. Shallow trench shape 13, is shown in FIG. 2, with a tapered side, at an angle between about 15 to 60 degrees, however if desired the sides of shallow trench shape 13, can be formed at a 90° angle, to the bottom of the shallow trench shape.

Figure 3:
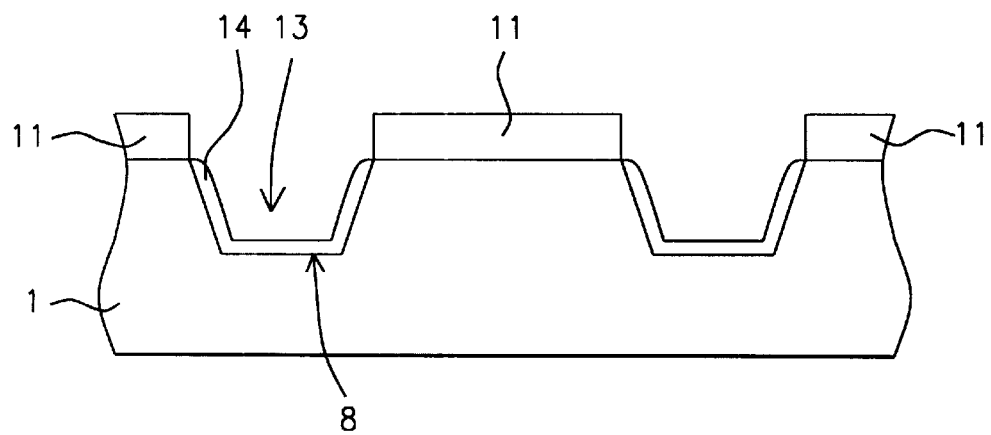
Figure 4:
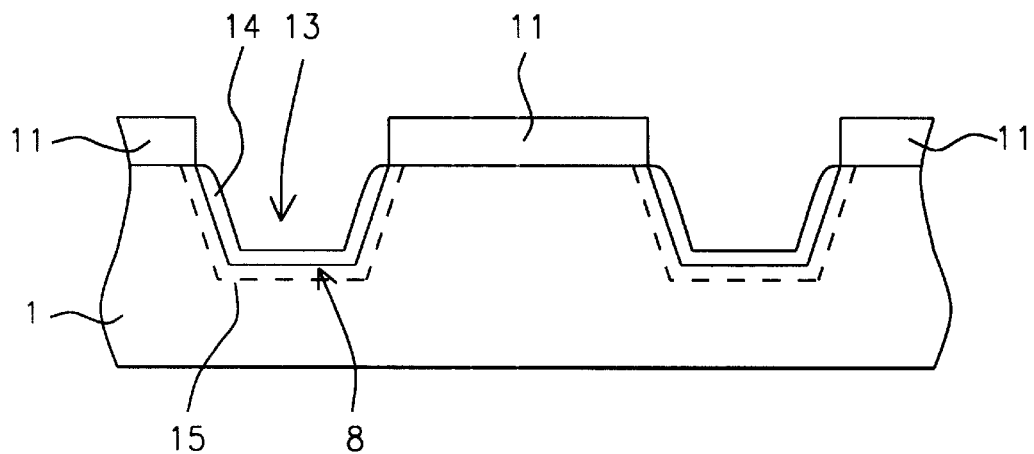

After removal of photoresist shape 12, via plasma oxygen ashing and careful wet cleans, thin silicon oxide layer 14, is thermally grown in an oxygen—steam ambient, at a temperature between about 700 to 900° C., to a thickness between about 100 to 300 Angstroms, lining the exposed surfaces of shallow trench shape 13. This is schematically shown in FIG. 3. A critical ion implantation procedure is next performed, using nitrogen ions, at an energy between about 15 to 50 KeV, at a dose between about 1E14 to 5E15 atoms/$cm^2$, and at an implant angle between about 15 to 60 degrees. The large implant angle results in a higher concentration of nitrogen at the sides of the shallow trench shape, than at the bottom of shallow trench shape. Thick silicon nitride layer 11, prevented implantation of nitrogen ions, into regions other than the shallow trench shape. Nitrogen rich, silicon region 15, comprised of implanted nitrogen, at the interface of shallow trench shape 13, and semiconductor substrate 1, will reduce, or block the movement of boron to edge 8, during subsequent thermal cycles, thus reducing the magnitude of the RNCE phenomena. The nitrogen rich, silicon region 15, is schematically shown in FIG. 4.

Figure 5A:
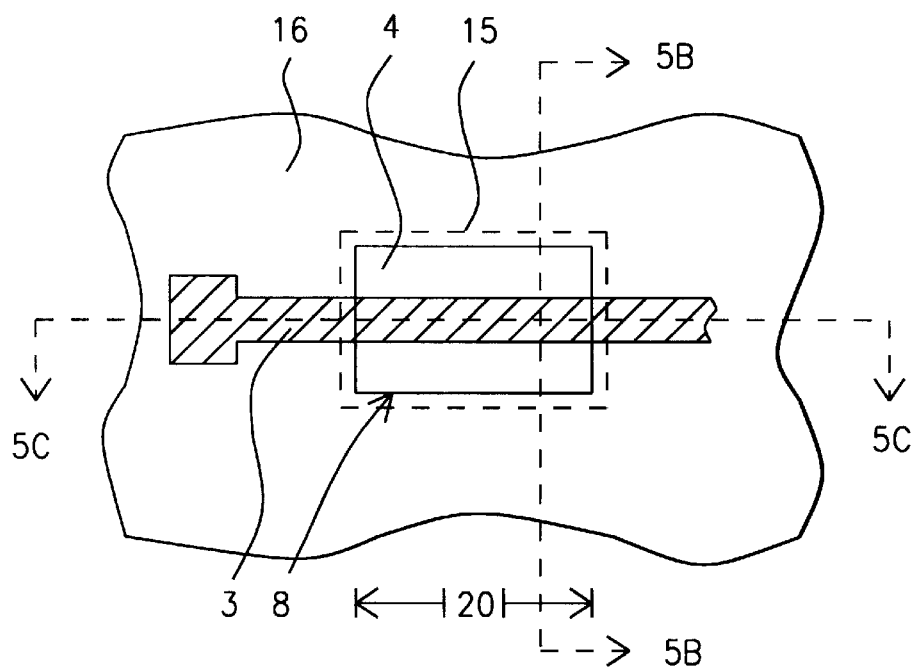
Figure 5B:
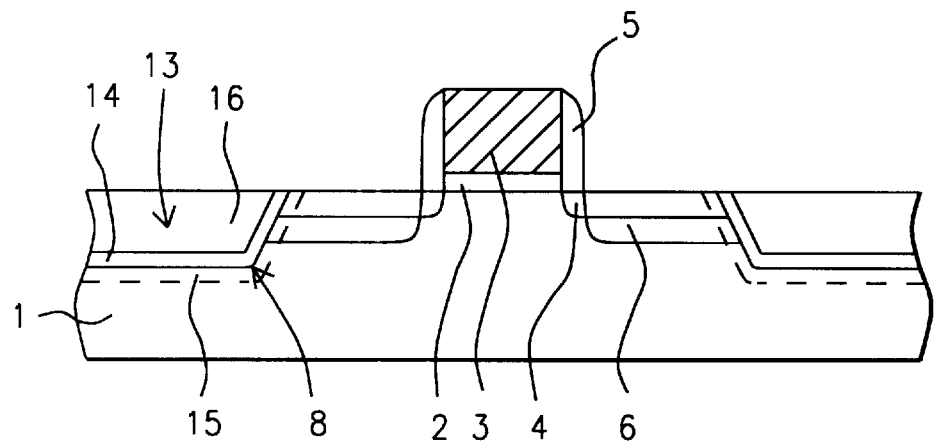
Figure 5C:
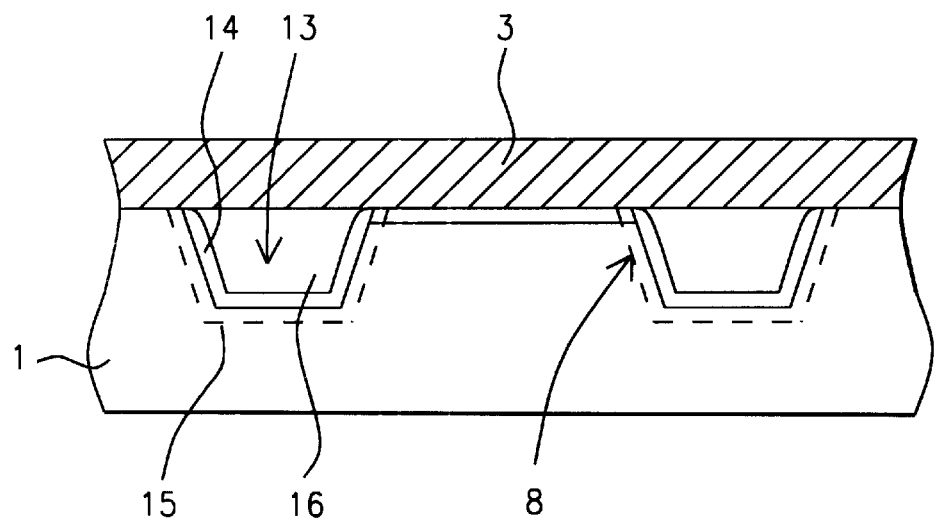

The completion of the NFET device, is schematically shown, in cross-sectional style, in FIGS. 5B, and 5C, while FIG. 5A, schematically shows the top view of the completed N channel, (NFET), device. First, silicon oxide layer 16, obtained via PECVD, LPCVD, or high density plasma chemical vapor deposition, (HDPCVD), procedures, at a thickness between about 5000 to 7000 Angstroms, is used to completely fill shallow trench shape 13. A chemical mechanical polishing, (CMP), procedure, or a selective RIE procedure, using $CHF_3$ as an etchant, is used to remove unwanted regions of silicon oxide layer 16, while a hot phosphoric acid solution is used to remove masking silicon nitride layer 11, from the top surface of semiconductor substrate 1. A threshold adjust ion implantation procedure, placing a specific level of P type dopant, such as boron or $BF_2$, needed to obtain the desired threshold voltage, is next performed, at an energy between about 20 to 40 KeV, at a dose between about 2E12 to 1E13 atoms/$cm^2$. (The threshold adjust region, is not shown in the drawings). A silicon dioxide gate insulator layer 2, is thermally grown, in an oxygen-steam ambient, at a temperature between about 600 to 900° C., to a thickness between about 25 to 70 Angstroms. Movement of boron, from the channel region, to interstitial silicon, at shallow trench edge 8, is now reduced, via the creation of nitrogen rich, silicon region 15, at shallow trench edge 8. The result of these procedures are schematically shown in cross-sectional style in FIGS. 5B and 5C.

A polysilicon, or polycide, (metal silicide-polysilicon layer), is next deposited, via LPCVD procedures, at a thickness between about 1500 to 3000 Angstroms. The polysilicon layer is either doped in situ, during deposition, via the addition of arsine, or phosphine, to a silane ambient, or the polysilicon layer is deposited intrinsically, then doped via an ion implantation procedure, using arsenic, or phosphorous ions. The polycide layer, used if lower word line resistance is required, is obtained via an LPCVD procedure of an underlying polysilicon layer, at a thickness between about 1500 to 3000 Angstroms, and an overlying metal silicide layer, such as tungsten silicide, at a thickness between about 400 to 1000 Angstroms. Polysilicon, or polycide gate structure 3, is then formed via conventional photolithographic and anisotropic RIE procedures, using $Cl_2$ as an etchant. Polysilicon gate structure 3, overlying silicon dioxide gate insulator layer 2, is schematically shown, in cross-sectional style in FIGS. 5B and 5C. The photoresist shape, used for definition of polysilicon gate structure 3, is removed via plasma oxygen ashing and careful wet cleans.

Lightly doped source/drain region 4, is next formed via ion implantation of arsenic, or phosphorous ions, at an energy between about 3 to 5 KeV, at a dose between about 5E14 to 5E15 atoms/cm$^2$, followed by the creation of insulator spacers 5, on the sides of polysilicon gate structure 3. Insulator spacers 5, can be comprised of either silicon oxide, or silicon nitride, obtained via LPCVD or PECVD procedures, at a thickness between about 1200 to 2000 Angstroms, is deposited at a temperature between about 500 to 1000° C., then subjected to an anisotropic RIE procedure, creating insulator spacers 5. Transient enhanced diffusion, in the form of boron moving from the channel region, to edge 8, experienced during the deposition of the layer used for insulator spacers 5, was reduced via use of the blocking, nitrogen rich, silicon region 15. Heavily doped source/drain region 6, shown schematically in FIGS. 5B and 5C, is formed via ion implantation of arsenic, or phosphorous ions, at a energy between about 30 to 50 KeV, at a dose between about 1E15 to 6E15 atoms/cm$^2$. The movement of boron during an anneal procedure, used to activate the implanted ions in LDD region 4, as well as in heavily doped source/drain region 6, again was reduced as a result of nitrogen rich, silicon region 15. The anneal procedure is performed using rapid thermal anneal, (RTA), procedures, at a temperature between about 1000 to 1030° C., for a time between about 5 to 15 sec., in a nitrogen ambient. FIG. 5A, schematically shows the top view of the NFET device, with narrow channel width 20, however protected from boron depletion, and lower then expected threshold voltages, by nitrogen rich, silicon region 15.

While this invention has been shown and described with reference to, the preferred embodiments thereof, it will be understood by those skilled in the art that various changes in form and details may be made without departing from the spirit and scope of this invention.

What is claimed is:

1. A method of fabricating a MOSFET device, on a semiconductor substrate, comprising the steps of:

depositing a silicon nitride layer, on said semiconductor substrate;

forming tapered shallow trench shapes, in said silicon nitride layer, and in a top portion, of a first region of said semiconductor substrate, with the sides of said tapered shallow trench shapes at an angle between about 15 to 90 degrees in regards to the top surface of said semiconductor substrate, while a second region of said semiconductor substrate, to be used as an active device region, remains unetched;

growing a first silicon oxide layer, on the sides of, and at the bottom of, said tapered shallow trench shapes;

performing an ion implantation procedure, at an implant angle between about 15 to 60 degrees, through said first silicon oxide layer, on the sides of said tapered shallow trench shapes, and through said first silicon oxide layer, located at the bottom of said tapered shallow trench shapes, resulting in a first concentration of implanted ions supplied at the sides of said tapered shallow trench shape, greater in implanted ion concentration than a second concentration of implanted ions supplied at the bottom of said tapered shallow trench shape, forming a nitrogen rich, silicon layer, in a region of said semiconductor substrate adjacent to the sides of, and adjacent to the bottom of, said tapered shallow trench shapes;

depositing a second silicon oxide layer, completely filling tapered shallow trench shapes;

removing the portions of, said second silicon oxide layer, and said silicon nitride layer, from the top surface of said semiconductor substrate, creating insulator filled, tapered shallow trench regions, with said active device region now located between said insulator filled tapered shallow trench regions;

ion implanting a first conductivity imparting dopant, to create a threshold adjust region in said active device region of said semiconductor substrate, located between insulator filled, tapered shallow trench regions;

growing a silicon dioxide gate insulator layer, on said active device region of said semiconductor substrate;

forming a gate structure, on said silicon dioxide gate insulator layer, and on said insulator filled, tapered shallow trench regions, resulting in a narrow channel width region, in said active device region, parallel to said gate structure, and located between said insulator filled tapered shallow trench regions;

ion implanting a second conductivity imparting dopant into an area of said active device region, not covered by said gate structure, to create said lightly doped source/drain region;

forming insulator spacers on the sides of said gate structures;

ion implanting a third conductivity imparting dopant into an area of said active device region, not covered by said gate structure, and not covered by said insulator spacers, to create a heavily doped source/drain region; and performing an anneal procedure, to activate dopants in said lightly doped source/drain region, and to activate dopants in said heavily doped source/drain region.

2. The method of claim 1, wherein said silicon nitride layer is obtained using either LPCVD, or PECVD procedures, at a thickness between about 1000 to 3000 Angstroms.

3. The method of claim 1, wherein said tapered shallow trench shapes, are formed in said silicon nitride layer, and in said top portion, of said first region of said semiconductor substrate, via a RIE procedure, using $CHF_3$ as an etchant for said silicon nitride layer, and using $Cl_2$ as an etchant for said semiconductor substrate.

4. The method of claim 1, wherein said tapered shallow trench shapes are formed to a depth, in said top portion, of said first region of said semiconductor substrate, between about 3000 to 4000 Angstroms.

5. The method of claim 1, wherein said first silicon oxide layer, formed on the surfaces of said tapered shallow trench shapes, is thermally grown, to a thickness between about 100 to 300 Angstroms, in an oxygen-steam ambient, at a temperature between about 700 to 900° C.

6. The method of claim 1, wherein said ion implantation procedure, used to create said nitrogen rich, silicon layer, in a region of said semiconductor substrate, adjacent to the sides of, and adjacent to the bottom of, said tapered shallow trench shapes, is performed using nitrogen ions, at an energy between about 15 to 50 KeV, and at a dose between about 1E14 to 5E15 atoms/cm$^2$.

7. The method of claim 1, wherein said second silicon oxide layer, used to completely fill said tapered shallow trench shapes, is obtained via LPCVD, PECVD. or HDPCVD procedures, at a thickness between about 5000 to 7000 Angstroms.

8. A method of fabricating a narrow channel width, MOSFET device, on a semiconductor substrate, using a large angle, nitrogen ion implantation procedure, performed to a tapered shallow trench shape, prior to insulator filling of the tapered shallow trench shape, to form a nitrogen rich, silicon layer at said tapered shallow trench shape-semiconductor substrate interface, comprising the steps of:

forming a thick silicon nitride layer, on said semiconductor substrate;

forming tapered shallow trench shapes in said thick silicon nitride layer, and in a first region, of a top portion of said semiconductor substrate, leaving a second region of said semiconductor substrate, to be used for an active device region of said narrow channel width MOSFET device, unetched;

growing a thin silicon oxide layer on the sides of, and on the bottom of, the portion of said tapered shallow trench shapes, located in said top portion of said semiconductor substrate;

performing said large angle, nitrogen ion implantation procedure, through said thin silicon oxide layer, and into a region of said semiconductor substrate, located at said tapered shallow trench shape-semiconductor interface, supplying a first concentration of nitrogen ions at tapered sides of said tapered shallow trench shape, and supplying a second concentration of nitrogen ions supplied at the non-tapered bottom surface of said tapered shallow trench shape, with the concentration of nitrogen ions larger for said first concentration of nitrogen ions than for said second concentration of nitrogen ions, thus resulting in said nitrogen rich, silicon layer, at said tapered shallow trench shape-semiconductor substrate interface, featuring a first portion of said nitrogen rich silicon layer, located at the sides of said tapered shallow trench shape, richer in nitrogen then a second portion of said nitrogen rich silicon layer located at the bottom of said tapered shallow trench shape;

depositing a silicon oxide trench fill layer, completely filling said tapered shallow trench shapes;

removing the portion of, said silicon oxide trench fill layer, and said silicon nitride layer, from the top surface of said semiconductor substrate, creating insulator filled shallow trenches, with said active device region now located between said insulator filled, shallow trenches;

forming a threshold adjust region, in said active device region;

growing a silicon dioxide gate insulator layer, on said active device region;

forming a gate structure, on said silicon dioxide gate insulator layer, and on said insulator filled, shallow trenches, resulting in a narrow channel width region, in said active device region, parallel to said gate structure, and located between said insulator filled, shallow trenches;

forming a lightly doped source/drain region, in an area of said active device region, not covered by said gate structure;

forming insulator spacers on the sides of said gate structure;

forming a heavily doped source/drain region, in an area of said active device region not covered by said gate structure, and not covered by said insulator spacers; and performing an anneal cycle.

9. The method of claim 8, wherein said thick silicon nitride layer is obtained using either LPCVD or PECVD procedures, at a thickness between about 1000 to 3000 Angstroms.

10. The method of claim 8, wherein said tapered shallow trench shapes are formed in said thick silicon nitride layer, and in said top portion, of said first region of said semiconductor substrate, via a RIE procedure, using $CHF_3$ as an etchant for said thick silicon nitride layer, and using $Cl_2$ as an etchant for said semiconductor substrate.

11. The method of claim 8, wherein the depth of said tapered shallow trench shapes, in said top portion, of said first region of said semiconductor substrate, is between about 3000 to 4000 Angstroms.

12. The method of claim 8, wherein said thin silicon oxide layer, on the sides of, and at the bottom of, said tapered shallow trench shapes, is thermally grown, to a thickness between about 100 to 300 Angstroms, in an oxygen-steam ambient, at a temperature between about 700 to 900° C.

13. The method of claim 8, wherein said large angle, nitrogen ion implantation procedure, is performed using nitrogen ions, at an energy between about 15 to 50 KeV, at a dose between about 1E14 to 5E15 atoms/cm$^2$, using an implant angle between about 15 to 60 degrees.

14. The method of claim 8, wherein said silicon oxide trench fill layer is obtained via LPCVD, PECVD, or HDPCVD procedures, at a thickness between about 5000 to 7000 Angstroms.

* * * * *